(12) United States Patent
Masleid et al.

(10) Patent No.: US 7,872,516 B2
(45) Date of Patent: Jan. 18, 2011

(54) PRECISION PULSE GENERATOR

(75) Inventors: Robert P Masleid, Monte Sereno, CA (US); David Greenhill, Portola Valley, CA (US)

(73) Assignee: Oracle America, Inc., Redwood City, CA (US)

(*) Notice: Subject to any disclaimer, the term of this patent is extended or adjusted under 35 U.S.C. 154(b) by 36 days.

(21) Appl. No.: 12/277,864

(22) Filed: Nov. 25, 2008

(65) Prior Publication Data

US 2010/0127749 A1  May 27, 2010

(51) Int. Cl.
*H03K 3/013* (2006.01)

(52) U.S. Cl. .................. 327/299; 327/166; 327/172; 327/291

(58) Field of Classification Search .............. None
See application file for complete search history.

(56) References Cited

U.S. PATENT DOCUMENTS

| | | | |
|---|---|---|---|
| 5,557,225 A * | 9/1996 | Denham et al. ........... 327/199 |
| 6,426,652 B1 | 7/2002 | Greenhill et al. |
| 7,071,747 B1 | 7/2006 | Masleid |
| 7,119,580 B2 | 10/2006 | Masleid et al. |
| 7,236,036 B2 * | 6/2007 | Branch et al. ........... 327/291 |
| 7,256,634 B2 | 8/2007 | Masleid |

* cited by examiner

*Primary Examiner*—An T Luu
(74) *Attorney, Agent, or Firm*—Meyertons, Hood, Kivlin, Kowert & Goetzel, P.C.; Erik A. Heter

(57) ABSTRACT

A pulse generator circuit. The pulse generator circuit includes a precharge circuit coupled to receive a clock signal alternating between a first logic level and a second logic level, a storage circuit having a storage node, wherein the precharge circuit is configured to precharge the storage node when the clock signal is at the first logic level, a logic circuit having an output, a first input node coupled to receive the clock signal, and a second input node coupled to the storage node and configured to produce a pulse at the second logic level responsive to the clock signal transitioning to the second logic level, and a discharge circuit configured to discharge the storage node at a predetermined delay time subsequent to the clock signal transitioning to the second logic level, wherein the output of the logic circuit transitions to the first logic level responsive to discharging the storage node.

16 Claims, 4 Drawing Sheets

US 7,872,516 B2

PRECISION PULSE GENERATOR

BACKGROUND OF THE INVENTION

1. Field of the Invention

This invention relates to electronic circuits, and more particularly, to pulse generating circuits.

2. Description of the Related Art

Pulse generating circuits are well known in the art of electronics. Pulse generators may be defined by such factors as pulse repetition rate (i.e. frequency), pulse width, trigger delay, duty cycle, rise and fall times, and voltage levels (i.e. of high and low signals).

FIG. 1A is a schematic diagram of one embodiment of a pulse generator circuit. In the embodiment shown, pulse generator 10 includes a NAND gate and an odd number of inverters coupled in series to form a delay chain. A clock input ('clk') is provided directly to one of the inputs of the NAND gate, and is also input into the delay chain. When the input clock signal and the delayed clock signal are both high, the output of the NAND gate will fall low. The low from the NAND gate may be provided to a clock header having an odd number of inversions to produce a high pulse that has substantially the same width as the low pulse from the NAND gate.

FIG. 1B is a schematic diagram of an alternate embodiment of a pulse generator. In this embodiment, pulse generator 20 includes a delay chain having only 5 inverters (instead of 13, as in the example of FIG. 1A). However, each of the inverters includes two PMOS devices and two NMOS devices, as shown, in contrast to typical inverters that include only one each of a PMOS and NMOS device. Such an inverter configuration may provide a higher input capacitance and lower drive may thus generate delay more efficiently than the typical inverter configuration having only one PMOS device and one NMOS device.

Thus, variations of either of the embodiments discussed above may be used to construct pulse generators. Factors such as desired pulse width may determine the number of inverters used in constructing the pulse generator circuit. If delay efficiency is a design priority, the inverters of the type shown in FIG. 1B may be used in lieu of the standard inverter type used in FIG. 1A.

In implementing the pulse generators discussed above, device size (and more specifically, channel width of the transistors used) is one factor to be considered in the design. Pulse generators may be implemented with smaller devices when it is desirable to minimize power consumption. However, smaller devices are more subject to process variation during manufacturing. Accordingly, variations from one pulse generator to another, when implemented using small devices, may result in a corresponding variation in pulse widths from one pulse generator to another. Since such variations tend to be averaged out in larger devices, the use of such large devices may enable the manufacture of pulse generators having more uniform characteristics from one to another. However, larger devices typically consume more power than their smaller counterparts.

SUMMARY OF THE INVENTION

A pulse generator circuit is disclosed. In one embodiment, the pulse generator circuit includes a precharge circuit, wherein the precharge circuit is coupled to receive a clock signal that alternates between a first logic level and a second logic level. The pulse generator further includes a storage circuit having a storage node, and wherein the precharge circuit is configured to precharge the storage node when the clock signal is at the first logic level. The pulse generator further includes a logic circuit having an output, a first input node coupled to receive the clock signal, and a second input node coupled to the storage node. The logic circuit is configured to produce a pulse at the second logic level responsive to the clock signal transitioning to the second logic level. The pulse generator further includes a discharge circuit configured to discharge the storage node at a predetermined delay time subsequent to the clock signal transitioning to the second logic level, wherein the output of the logic circuit transitions to the first logic level responsive to discharging the storage node.

A method for operating a pulse generator circuit is also disclosed. In one embodiment, the method includes receiving a clock signal, wherein the clock signal alternates between a first logic level and a second logic level, precharging a storage node when the clock signal is at the first logic level, and storing a logic signal at the second logic level on the storage node responsive to said precharging. The method further includes the clock signal transitioning from the first logic level to the second logic level, producing a pulse responsive to said transitioning, wherein the pulse is produced by logically combining the clock signal and the logic signal, receiving a feedback signal at a predetermined delay time subsequent to said producing; and discharging the storage node responsive to said receiving the feedback signal.

BRIEF DESCRIPTION OF THE DRAWINGS

Other aspects of the invention will become apparent upon reading the following detailed description and upon reference to the accompanying drawings in which.

Figure 1A:
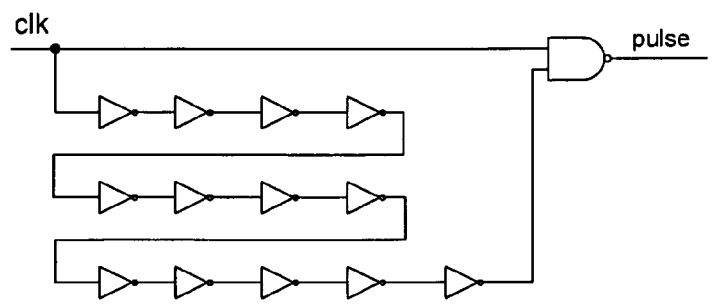
FIG. 1A (Prior Art) is a schematic diagram of a prior art pulse generator circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Figure 2:
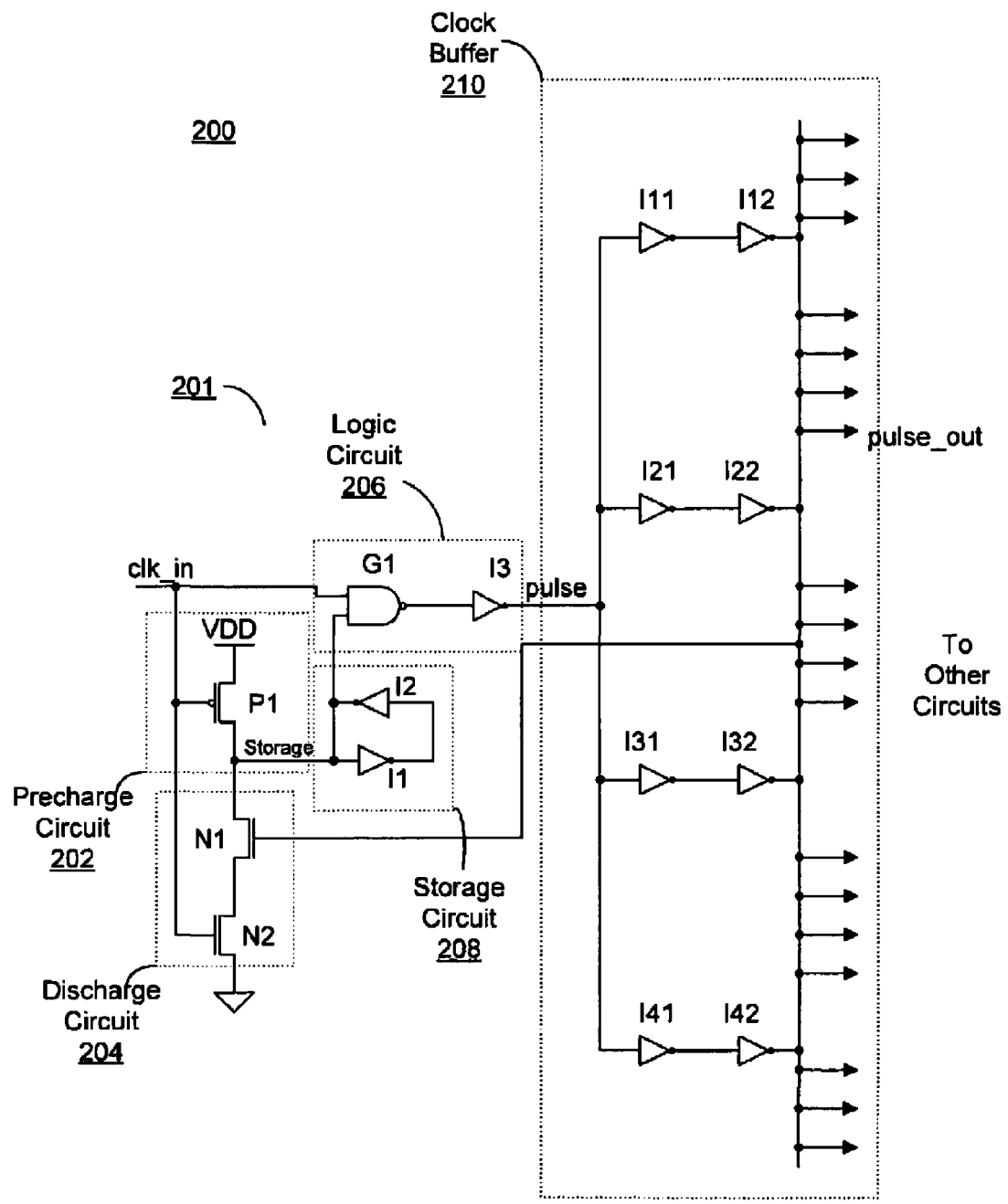
FIG. 2 is a schematic diagram of one embodiment of a pulse generator circuit coupled to receive feedback from a node of an associated clock buffer circuit.

Turning now to FIG. 2, a schematic diagram of one embodiment of a pulse generator circuit coupled to receive feedback from a node of an associated clock buffer circuit is shown. In the embodiment shown, electronic circuit 200 includes pulse generator circuit 201 and clock buffer 210. Pulse generator circuit 201 in this embodiment includes a precharge circuit 202, a discharge circuit 204, a logic circuit 206, and a storage circuit 208.

Precharge circuit 202 in the embodiment shown includes transistor P1. When the input clock signal, clk_in, is low, transistor P1 is activated. When transistor P1 is turned on, a pull-up path exists between the storage node ('storage') and VDD. Thus, the storage node is precharged to a logic high value during the low portion of the clock cycle in this embodiment. The precharge is discontinued when the input clock signal transitions to a logic high by deactivating transistor P1. However, the logic high value may be captured and initially held on the storage node by storage circuit 208 after the precharge is discontinued. In this example, storage circuit 208 is implemented using cross-coupled inverters I1 and I2. Embodiments utilizing other types of storage circuits are possible and contemplated.

In this particular embodiment, logic circuit 206 includes NAND gate G1 and inverter I3. Other types of logic circuits are possible and contemplated. For example, an AND gate could be used to replace the NAND gate in the example shown if it were desirable to eliminate the delay provided by I3. Another possibility would be to expand the 2-input NAND gate into a 3-input NAND gate. Yet another possibility would be to add disable logic or a disable input to logic circuit 206. Embodiments with additional gates/circuitry are also possible, particularly for embodiments where it may be desirable to add delay to the output pulse.

When the input clock signal transitions from low to high in this embodiment, both inputs on NAND gate G1 are a logic high (due to the precharge of the storage node). This results in a logic low output by NAND gate G1 and a logic high value produced by the output of inverter I3. Accordingly, the pulse generated by pulse generator 201 is produced at the output of inverter I3 in this embodiment.

In one embodiment, where fan-out 4 (FO4) is considered to be a single unit of delay (i.e., the delay produced by 1 inverter driving four loads on its output), the pulse output by logic circuit 206 is produced at a delay of 4 FO4 after the input clock signal transitions from low to high. However, this delay may be different in other embodiments, and may vary according to the type of logic circuitry used to implement logic circuit 206, the sizes and types of devices (i.e. transistors) used to implement the various gates that make up the logic circuit, and so forth.

In this particular example, pulse generator circuit is coupled to provide the pulse to clock buffer 210, and is further configured to and coupled to provide a feedback signal to precharge circuit 201. Clock buffer circuit 210 includes a plurality of inverter pairs (e.g., I11 and I12, I21 and I22, and so on), where each inverter pair includes two inverters coupled in series. In other embodiments, inverter chains of a greater number are also possible and contemplated, (e.g., four inverters), as well as embodiments with a single inverter or an odd number of inverters (should it be desirable to invert the pulse, or should the pulse generator be configured to form a negative-going pulse). The inverter pairs of this embodiment of clock buffer 210 are coupled in series with each other between the pulse node ('pulse') and the output pulse node ('pulse_out'). Clock buffer 210 in the embodiment shown is configured to drive the pulse produced by pulse generator 201 to a number of different circuits that utilize the pulse (e.g., a plurality of pulse flops). The inverter pairs in the embodiment shown provide additional delay between the pulse node and the output pulse node. Variations in the delay from one inverter pair to the next may be averaged out by coupling them in parallel as shown.

Figure 3:
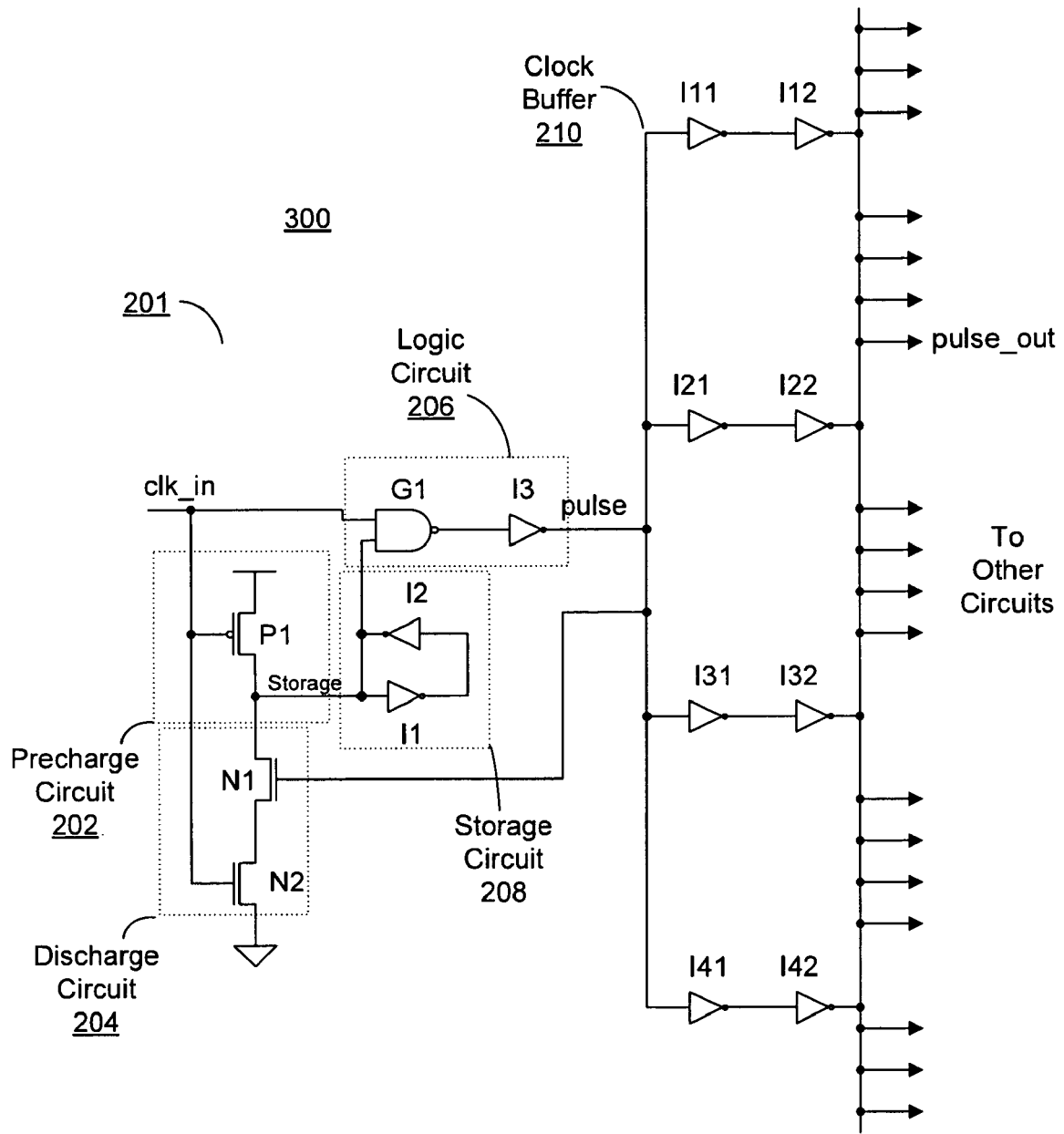
FIG. 3 is a schematic diagram of one embodiment of a pulse generator circuit coupled to received feedback from different node of the associated clock buffer circuit.

In the embodiment shown in FIG. 2, clock buffer 210 is coupled to provide a feedback signal to pulse generator 201 from the output pulse node. Alternatively, as shown in the embodiment of FIG. 3, clock buffer 210 may be coupled to provide the feedback signal to pulse generator 201 from the pulse node. The coupling may be provided based on the amount of delay desired, and thus the pulse width desired. In general, the embodiment of FIG. 2, where the feedback signal path is provided from the output pulse node, may provide additional delay and thus a wider pulse than the embodiment of FIG. 3.

In the embodiment shown, the feedback signal is provided to discharge circuit 204, and more particularly to transistor N1. Discharge circuit 204 includes both transistor N1 and transistor N2. When the input clock signal transitions high, transistor N2 is activated. However, transistor N1 remains deactivated until the feedback signal is received, which occurs responsive to the pulse and at a predetermined delay time thereafter according to the design/configuration of the circuit. In the circuit of FIG. 2, transistor N1 is turned on responsive to the pulse propagating to the output pulse node. Thus, for the circuit of FIG. 2, a significant amount of the delay, and thus the pulse width, is provided by the inverter pairs of clock buffer 210. In the circuit of FIG. 3, transistor N1 is turned on responsive to the pulse propagating to the pulse node. Thus, for the circuit of FIG. 3, the primary factor in determining the pulse width is the delay provided by NAND gate G1 and inverter I3.

When transistor N1 is activated and the clock signal is still high (resulting in transistor N2 being activated as well), a discharge path exists between the storage node and ground. Thus, when both of these devices are activated, the storage node is discharged to ground, i.e. a logic low replaces the logic high on the storage node. When the storage node falls low as a result of the discharge, the output of NAND gate G1 will transition high, with the output of inverter I3 subsequently falling low as a result, and the output pulse node falling low approximately two inverter delays later.

In the embodiment shown in FIG. 2, the feedback signal will fall low when the output pulse node falls low. For the embodiment of FIG. 3, the feedback signal falls low when the pulse node falls low. When the feedback signal falls low, transistor N1 is deactivated, and the discharge operation is complete. In the embodiments of FIGS. 2 and 3, the feedback signal will remain low until the next pulse is generated. Similarly, the storage node will remain low until the clock falls low It should be noted that while pulse generator 201 is coupled to clock header 210 in the embodiments shown in both FIGS. 2 and 3, other circuit embodiments are also possible and contemplated. In general, the pulse generator circuit 201 may be coupled to any other suitable type of electronic circuit, many of which may be used to produce a delay than can be added to the logic circuit delay and thereby used to affect the desired pulse width.

Figure 4:
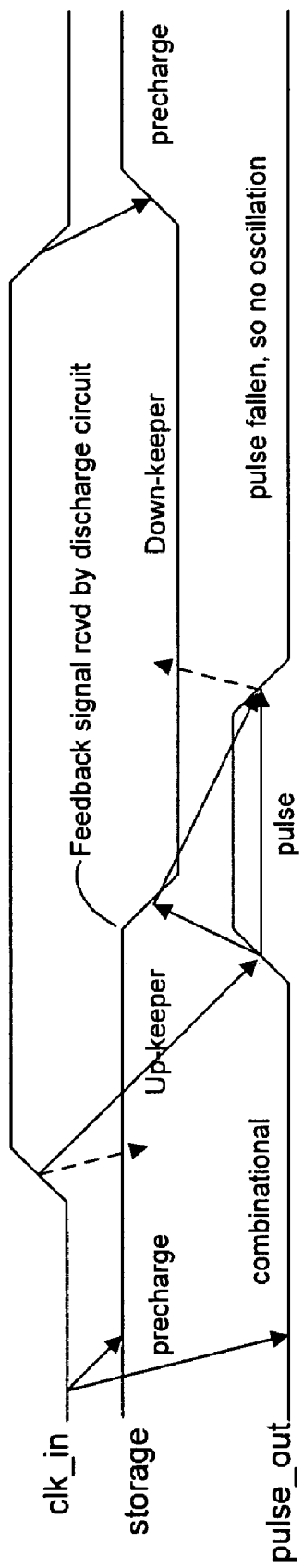
FIG. 4 is a timing diagram illustrating operation of one embodiment of a pulse generator circuit.

Turning now to FIG. 4, a timing diagram illustrating operation of one embodiment of a pulse generator circuit is shown. In particular, the timing diagram shown in FIG. 4 corresponds to the operation of pulse generator 201 illustrated in FIG. 2 and FIG. 3. In the example shown, an input clock signal ('clk_in') alternates between a first logic level and a second logic level (and more particularly, between a logic low and a logic high level). When the clock is low, a precharge operation takes place on the storage node ('storage'), which caused a keeper circuit to capture a logic high level.

After the input clock signal transitions high, the logic high level is initially held by the keeper. Since, at this point of the circuit operation, both the input clock signal and the signal on the storage node are at logic high values, logic circuit 206 will produce a logic high value (based on the NAND and inverter coupled as shown in FIGS. 2 and 3). This will eventually result in a pulse produced on the output pulse node ('pulse_out'). The width of the pulse may depend in part upon the point where the feedback signal is connected relative to the output of the logic circuit. In the embodiment of FIG. 3, the pulse width will be narrower than that of the embodiment of FIG. 2, assuming they both have the same device (i.e. transistor) sizes. For example, the embodiment of FIG. 3, in which the feedback signal originates at the pulse node, may produce a pulse having a width of 3 FO4. The embodiment of FIG. 2, in which the feedback signal originates at the pulse_out node, may produce a pulse having a width of 5 FO4, since the feedback circuit originates at a point of two inverter delay times later. It should be noted however that the width of the pulse produced may also depend on the arrangement of logic circuit 206, and more particularly, the delay provided thereby. Accordingly, the pulse width produced by pulse generator 201 may be determined by both the delay generated by the logic circuit, as well as the point of origin of the feedback signal (which may be subject to additional delay over that generated by the logic circuit, e.g., as in the embodiment shown in FIG. 2).

In the embodiment of FIG. 2, once the generated pulse appears on the output node, it is provided as a feedback signal to discharge circuit 204. In the embodiment of FIG. 3, the pulse is provided as a feedback signal when it appears on the pulse node, which is the output node of logic circuit 206. When the feedback signal is received by discharge circuit 204, the storage node is discharged, and thus the logic value on the storage node falls low, as shown in the timing diagram. As a result of the storage node falling low, the pulse node will also fall low, at a delay time later according to the delay of logic circuit 206. In the embodiment of FIG. 3, the feedback signal will fall low when the pulse node falls low, while the feedback signal falls low when the output pulse node falls low in the embodiment of FIG. 2. When the feedback signal falls low, discharge circuit 206 will be deactivated, while storage circuit 208 will hold a logic low on the storage node. Thus, oscillation is prevented, as the storage node will remain at a logic low level until the input clock signal falls low again. Similarly, feedback circuit 206 will remain inactive until at least the time at which the next pulse is generated by pulse generator 201.

Figure 1B:
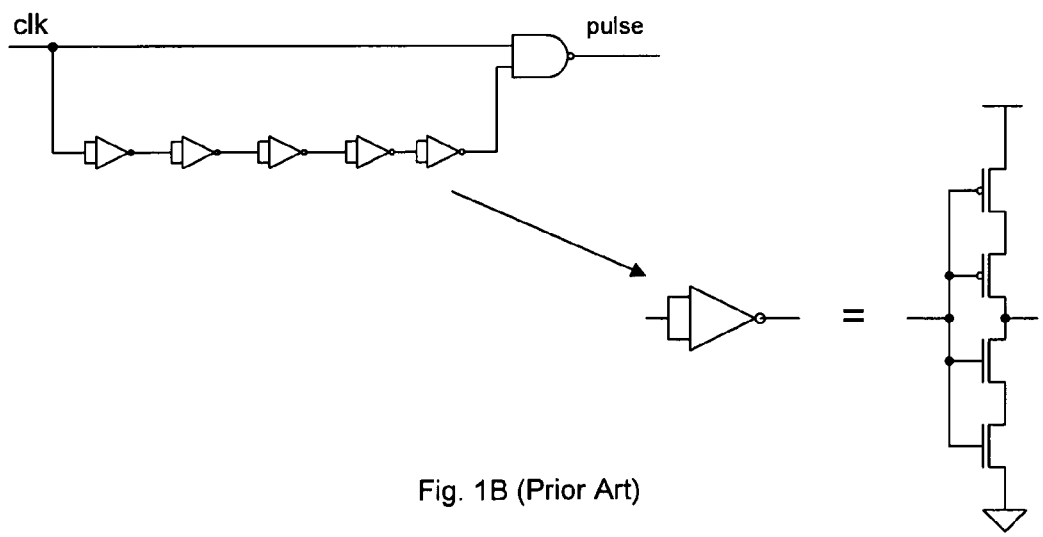
FIG. 1B (Prior Art) is a schematic diagram of another prior art pulse generator circuit.

The configuration of the pulse generator circuit 201 shown in FIGS. 2 and 3, and variations thereof, may allow smaller devices to be used, while providing the ability to generate a precision pulse with low variation. In the prior art pulse generators shown in FIGS. 1A and 1B, there may be tradeoff between power and area consumption on one hand, and pulse variability on the other hand. Pulse generator circuits such as those in FIGS. 1A and 1B, when implemented with large devices, may be able to produce a pulse of low variability, at the expense of consuming more circuit area and more power. Those same pulse generator circuits, if implemented using small devices, may consume less power and less circuit area, but due to process variations, may produce pulses that are, from one pulse generator to the next, too variable in width to be reliable for many applications. In contrast, the pulse generator circuits illustrated in FIGS. 2 and 3 may be implemented using preexisting large devices, thereby consuming less power and less circuit area, while still having the capability to produce pulses of sufficient precision to be useful in a wide variety of applications. For example, pulse generator 201 may be suitable for use in high-speed circuits that include storage elements such as pulse flops, which require a pulse of sufficient precision that it allows enough setup and hold time, but does not remain transparent for too long (which can result in the pulse flop failing to capture the correct logic value).

It should be noted that the circuits shown in FIGS. 2 and 3 are exemplary, and that other circuit arrangements for implementing a pulse generator are possible and contemplated.

Broadly speaking, a pulse generator in accordance with this disclosure includes a precharge circuit configured to precharge a storage node, a storage circuit that includes the storage node, a logic circuit configured to produce a pulse based on the logic value stored on the storage node and an input clock signal, and a discharge circuit configured to discharge the storage node responsive to receiving a feedback signal, wherein the feedback signal is generated responsive to the pulse. Variations of the respective implementations of any of these elements (e.g., different implementations of a storage circuit, a discharge circuit, and so forth) are possible and contemplated within the scope of this disclosure.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
    a precharge circuit, wherein the precharge circuit is coupled to receive a clock signal, wherein the clock signal alternates between a first logic level and a second logic level;
    a storage circuit, wherein the storage circuit includes a storage node, wherein the precharge circuit is configured to precharge the storage node when the clock signal is at the first logic level;
    a logic circuit having an output, a first input coupled to receive the clock signal, and a second input coupled to the storage node, wherein the logic circuit is configured to produce a pulse at the second logic level responsive to the clock signal transitioning to the second logic level; and
    a discharge circuit including first and second transistors coupled in series between the storage node and a ground node, wherein the discharge circuit is configured to discharge the storage node when both the first and second transistors are active, wherein the second transistor is configured to be activated responsive to receiving a feedback signal, wherein the storage node is discharged at a predetermined delay time subsequent to the clock signal transitioning to the second logic level, wherein the output of the logic circuit transitions to the first logic level responsive to discharging the storage node, and wherein the feedback signal is generated responsive to the logic circuit producing the pulse.

2. The electronic circuit as recited in claim 1, further comprising a clock buffer circuit, wherein the clock buffer circuit is coupled to receive the pulse from the logic circuit and further coupled to provide the feedback signal to the discharge circuit.

3. The electronic circuit as recited in claim 2, wherein the clock buffer includes at least one inverter chain including at least a first inverter and a second inverter coupled in series, wherein an input to the at least one inverter chain is coupled to receive the pulse from the logic circuit.

4. The electronic circuit as recited in claim 3, wherein the clock buffer is arranged to provide the feedback signal from the output of the inverter chain.

5. The electronic circuit as recited in claim 3, wherein the clock buffer is arranged to provide the feedback signal from the input of the inverter chain.

6. The electronic circuit as recited in claim 3, wherein the clock buffer includes a plurality of inverter chains coupled in parallel.

7. The electronic circuit as recited in claim 2, wherein the first transistor is coupled to receive the clock signal and is configured to be activated when the clock signal is at the second logic level, and wherein the second transistor is coupled to receive the feedback signal and is configured to be activated when the feedback signal is at the second logic level.

8. The electronic circuit as recited in claim 7, wherein the second transistor is activated when the feedback signal is at the second logic level, and wherein the feedback signal transitions to the second logic level responsive to the pulse.

9. The electronic circuit as recited in claim 1, wherein the storage circuit includes a pair of cross-coupled inverters.

10. The electronic circuit as recited in claim 1, wherein the logic circuit includes a NAND gate and an inverter, wherein an output of the NAND gate is coupled to an input of the inverter.

11. A method of operating a pulse generator circuit, the method comprising:
 receiving a clock signal, wherein the clock signal alternates between a first logic level and a second logic level;
 precharging a storage node when the clock signal is at the first logic level;
 storing a logic signal at the second logic level on the storage node responsive to said precharging;
 transitioning the clock signal from the first logic level to the second logic level;
 producing a pulse responsive to said transitioning, wherein the pulse is produced by logically combining the clock signal and the logic signal;
 receiving a feedback signal at a predetermined delay time subsequent to said producing; and
 discharging the storage node through first and second transistors coupled in series between the storage node and a ground node responsive to said receiving the feedback signal.

12. The method as recited in claim 11 further comprising a clock buffer circuit receiving the pulse from the logic circuit and providing the feedback signal.

13. The method as recited in claim 12, wherein the clock buffer circuit includes at least one inverter chain, wherein an input to the at least one inverter chain is coupled to receive the pulse.

14. The method as recited in claim 13 further comprising providing the feedback signal from an output of the at least one inverter chain.

15. The method as recited in claim 13 further comprising providing the feedback signal from the input of the at least one inverter chain.

16. The method as recited in claim 11, wherein discharging the storage node comprises activating the first transistor responsive to the clock signal transitioning from the first logic level to the second logic level, and activating the second transistor responsive to the feedback signal transitioning to the second logic level.

* * * * *